(12) United States Patent
Hasegawa

(10) Patent No.: US 6,956,488 B2
(45) Date of Patent: Oct. 18, 2005

(54) METHOD OF AND APPARATUS FOR SETTING BATTERY ALARM VOLTAGE IN BATTERY MANAGEMENT SERVER

(75) Inventor: Susumu Hasegawa, Inagi (JP)

(73) Assignees: Fujitsu Limited, Kawasaki (JP); Fujitsu Frontech Limited, Tokyo (JP)

(*) Notice: Subject to any disclaimer, the term of this patent is extended or adjusted under 35 U.S.C. 154(b) by 113 days.

(21) Appl. No.: 10/736,847

(22) Filed: Dec. 17, 2003

(65) Prior Publication Data

US 2004/0135696 A1 Jul. 15, 2004

(30) Foreign Application Priority Data

Jan. 6, 2003 (JP) ..................................... 2003-000228

(51) Int. Cl.⁷ .............................................. G08B 21/00
(52) U.S. Cl. ............................ 340/636.15; 340/636.1; 340/636.15
(58) Field of Search ........................ 340/636.15, 636.1, 340/636.12, 636.13, 636.2; 320/135, 136, 149, 152, 155

(56) References Cited

U.S. PATENT DOCUMENTS

| | | | | |
|---|---|---|---|---|
| 5,726,636 A | * | 3/1998 | Hayes, Jr. ............... | 340/636.1 |
| 6,005,367 A | | 12/1999 | Rohde ..................... | 320/106 |
| 6,094,030 A | | 7/2000 | Gunthorpe et al. ........ | 320/116 |
| 6,236,326 B1 | * | 5/2001 | Murphy ................... | 340/636.1 |
| 6,459,896 B1 | * | 10/2002 | Liebenow ................. | 455/425 |
| 6,678,538 B1 | * | 1/2004 | Koizumi ................... | 455/574 |

FOREIGN PATENT DOCUMENTS

| | | |
|---|---|---|
| JP | 5-180914 A | 7/1993 |
| JP | 6-242195 | 9/1994 |
| JP | 3311416 | 5/2002 |

* cited by examiner

*Primary Examiner*—Toan N. Pham
(74) *Attorney, Agent, or Firm*—Staas & Halsey LLP

(57) ABSTRACT

A mobile information terminal includes a battery voltage detecting unit that detects a voltage of a battery, an alarm voltage detecting unit that detects an alarm voltage, and a suspend voltage detecting unit that detects a suspend voltage, and a terminal communication unit that transmits the voltage of the battery detected to a battery management server. The battery management server includes a voltage controller that automatically sets the battery alarm voltage based on the voltage of the battery detected, and a server communication unit that transmits the battery alarm voltage set to the mobile information terminal.

16 Claims, 8 Drawing Sheets

METHOD OF AND APPARATUS FOR SETTING BATTERY ALARM VOLTAGE IN BATTERY MANAGEMENT SERVER

BACKGROUND OF THE INVENTION

1) Field of the Invention

The present invention relates to a method of and an apparatus for setting a battery alarm voltage in a battery management server, and more particularly, to a method of and an apparatus for setting a battery alarm voltage for a personal digital assistant operated on a battery that is capable of communicating with the battery management server, which automatically sets the battery alarm voltage based on a residual amount of the battery voltage.

2) Description of the Related Art

In recent years, portable information terminal units such as notebook-size personal computers, personal digital assistants (PDAs), electronic notes, and portable telephones have been rapidly distributed as portably convenient mobile tools. Among them, the PDAs are used as dedicated terminals for the Internet, and are widely used among individuals as mobile tools to manage mails and schedules. Usually, as the PDAs are often carried, the PDAs use a battery as a power source, like the portable notebook-size personal computers.

When the device is continuously used in a state that the battery voltage is low, for example, the power may be lost. In such a case, it becomes impossible to use the device or ends up with losing data during operation of the device. Therefore, a battery alarm voltage is set to give an alarm with a display when the battery voltage drops to a predetermined value. Alternatively, an alarm sound is generated according to a residual amount of the battery.

There are a couple of techniques currently in use to manage the battery voltage. One technique (for example, see Japanese Patent Application Laid-open No. H5-180914) is to accurately keep track of the residual amount of the battery by always monitoring the battery charge. The other technique (for example, see Japanese Patent Publication No. 3311416) is to detect the residual amount of the battery corresponding to an operating condition by forecasting a battery holding time.

However, the conventional devices that manage the battery alarm voltage have the following drawbacks. Conventionally, a user is informed of a shortage of the battery with an alarm or the like, before the battery voltage drops to a complete discharge. When the battery is used for a long time, however, the operating time varies due to an internal degradation of the battery.

Figure 8A:
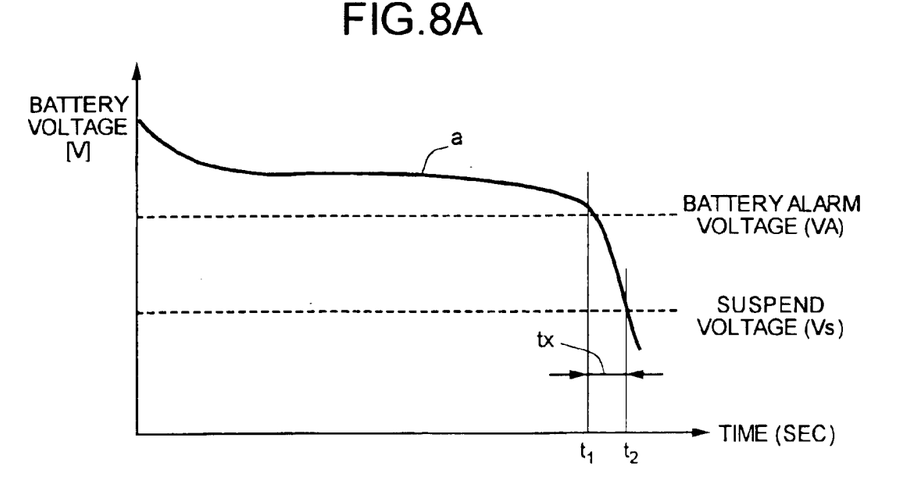
FIG. 8A and FIG. 8B are a graph of the discharge curve of a battery in an unused state, and a graph of the discharge curve of a degraded battery, respectively.
Figure 8B:
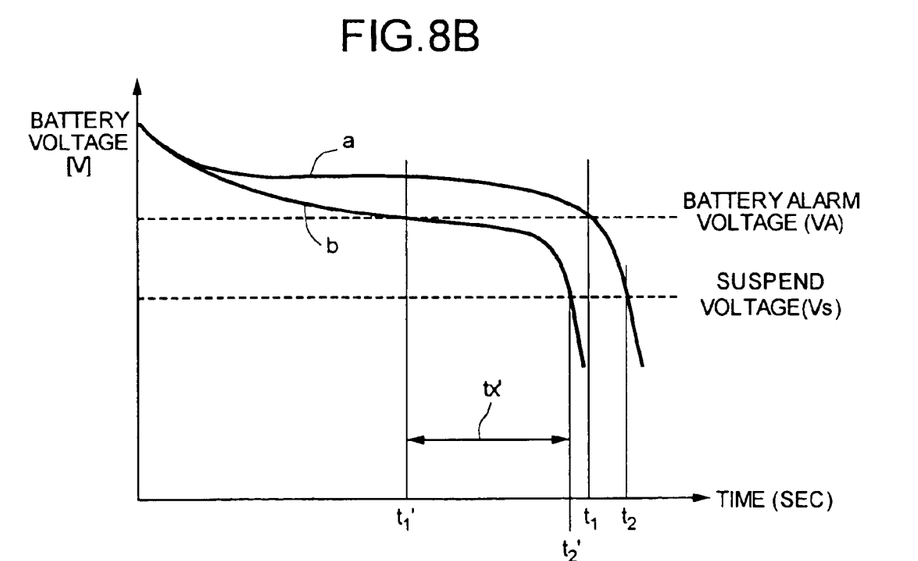

FIG. 8A and FIG. 8B are graphs of time-varying discharge curves due to a consumption of the battery. The vertical axis represents the battery voltage (V), and the horizontal axis represents an operating time (sec) of a device using the battery. A battery alarm voltage VA is a voltage that is preset to make an alarm that the battery voltage reaches near to a suspend voltage VS. The suspend voltage VS indicates that the battery voltage within the battery is substantially at a "zero volts" state, that is, a voltage level at which the device is in a non-operating state (i.e., a memory holding state).

When the residual amount of the battery decreases and when the voltage reaches the battery alarm voltage VA, the device generates an alarm. This alarm urges the user to charge the battery. When the battery voltage is consumed and drops to the suspend voltage VS, the device stops operating.

A discharge curve a in FIG. 8A represents the discharge curve of a battery of an unused (i.e., new) state. The battery voltage (i.e., residual amount) drops to the battery alarm voltage VA at t1 seconds. Since then, the voltage drops to the suspend voltage VS at t2 seconds after passing of tx seconds. In other words, the t2 seconds becomes the operating time of the battery when the battery is started in the unused state. As explained above, usually, the operating time of the battery is secured to enable the device to operate for a predetermined period of time tx (about ten minutes), even after the battery voltage drops to the battery alarm voltage VA.

On the other hand, a discharge curve b in FIG. 8B represents the discharge curve of a battery when it is used for a long time. When the battery is degraded, as the slope of the discharge curve becomes sharper, the voltage reaches the battery alarm voltage VA more quickly.

As shown in the example of FIG. 8B, the voltage drops to the battery alarm voltage VA at t1' seconds, and to the suspend voltage VS at t2' seconds. In this case, the time t2' seconds becomes the battery operating time when the battery is degraded. As a result, the device operation time tends to become short (t2'<t2).

When the battery is degraded, the voltage quickly reaches the battery alarm voltage VA that is preset, and therefore, an alarm is generated frequently, despite the fact that considerable operating time (tx' seconds) still remains before the voltage reaches the suspend voltage VS. Consequently, the charging interval becomes short, which causes an increase in the number of times of charging.

SUMMARY OF THE INVENTION

It is an object of the present invention to solve at least the problems in the conventional technology.

The apparatus for setting a battery alarm voltage according to one aspect of the present invention is for a mobile information terminal that is capable of communicating with a battery management server. The mobile information terminal includes a battery voltage detecting unit that detects a voltage of a battery, an alarm voltage detecting unit that detects a battery alarm voltage for alarming a voltage drop of the battery, a suspend voltage detecting unit that detects a suspend voltage at which the mobile information terminal enters a suspend state following the voltage drop of the battery, and a terminal communication unit that transmits the voltage of the battery detected to the battery management server. The battery management server includes a voltage controller that automatically sets the battery alarm voltage based on the voltage of the battery detected, and a server communication unit that transmits the battery alarm voltage set to the mobile information terminal.

The method of setting a battery alarm voltage for a mobile information terminal, which is capable of communicating with a battery management server, according to another aspect of the present invention includes detecting a voltage of a battery, detecting a battery alarm voltage for alarming a voltage drop of the battery, detecting a suspend voltage at which the mobile information terminal enters a suspend state following the voltage drop of the battery, transmitting the voltage of the battery detected to the battery management server, setting automatically the battery alarm voltage based on the voltage of the battery detected, and transmitting the battery alarm voltage set to the mobile information terminal.

The other objects, features and advantages of the present invention are specifically set forth in or will become apparent from the following detailed descriptions of the invention when read in conjunction with the accompanying drawings.

DETAILED DESCRIPTION

Exemplary embodiments of the battery alarm voltage setting device and the battery alarm voltage setting method according to the present invention will be explained in detail with reference to the accompanying drawings.

In the present invention, a PDA 110 will be explained as one example of a portable information terminal unit. The PDA 110 operates based on a power supply from a battery provided inside. As described later, a cradle (i.e., a charger) 400 is used to charge a battery 280 inside the PDA 110.

Figure 1:
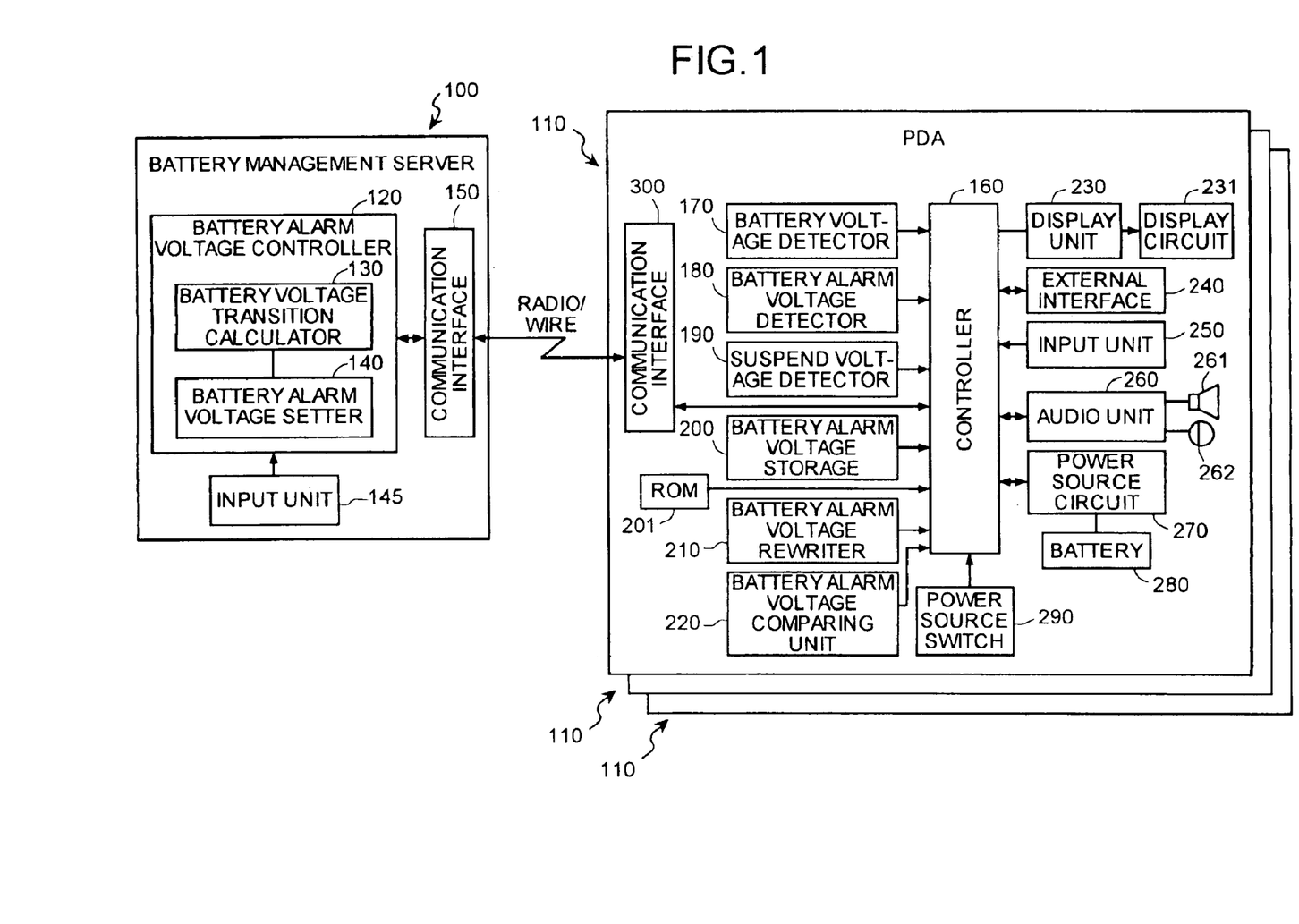
FIG. 1 is a schematic diagram of an apparatus for setting a battery alarm voltage according to the present invention.

FIG. 1 is a functional block diagram illustrating a total configuration of the battery alarm voltage setting device according to the first embodiment. As shown in this drawing, a battery management server 100 can manage the battery voltage of a plurality of (about ten) PDAs 110 in a state that the PDAs are connected for communication (via radio/wire). As described later, the battery management server 100 has a function of setting a battery alarm voltage.

In the present invention, the battery management server 100 receives the battery voltage transmitted from the PDA 110 at a specific timing. A battery alarm voltage controller 120 prepares (i.e., calculates) a discharge curve in advance based on the battery voltage. A battery alarm voltage set value can be automatically changed based on this discharge curve.

As shown in FIG. 1, the PDA 110 according to the first embodiment includes a controller 160 having a function of controlling the whole of the PDA 110, a battery voltage detector 170, a battery alarm voltage detector 180, a suspend voltage detector 190, a battery alarm voltage storage 200, a read only memory (ROM) 201, a battery alarm voltage rewriter 210, a battery alarm voltage comparing unit 220, a display circuit 230, a display unit 231, an external interface 240, an input unit 250, an audio unit 260 having a speaker 261 and a microphone 262, a power source circuit 270, a battery 280, a power source switch 290, and a communication interface 300.

The battery voltage detector 170 has a function of periodically detecting the battery voltage that decreases following the discharging of the battery. The battery alarm voltage detector 180 has a function of detecting the voltage that drops to a predetermined voltage following the discharging of the battery, as an alarm voltage. When the residual amount of the battery reaches the alarm voltage, an alarm is notified.

The suspend voltage detector 190 has a function of detecting a suspend voltage at which the PDA 110 becomes in a non-operation state following a fall in the battery voltage within the battery.

The battery alarm voltage storage 200 has a function of storing the battery alarm voltage set and transmitted by a battery alarm voltage setter 140 of the battery management server 100. The battery alarm voltage rewriter 210 has a function of rewriting the battery alarm voltage stored in the battery alarm voltage storage 200 into latest data transmitted from the battery alarm voltage setter 140.

The battery alarm voltage comparing unit 220 has a function of making a decision by comparing the latest data transmitted from the battery alarm voltage setter 140 with the data obtained by rewriting with the battery alarm voltage rewriter 210.

The ROM 201 stores in advance a screen control program to execute various kinds of processing and an application program.

The display unit 230 consists of a liquid crystal display (LCD), a tablet, and a back light (light source). The display circuit 230 controls the display brightness. The display unit 230 displays a message to notify a setting of the battery alarm voltage.

The input unit 250 has a function of rewriting the battery alarm voltage utilizing a keyboard, a mouse, or an external medium. Specifically, the external medium includes a flash memory card, a smart media card, and a memory stick used in a digital camera or the like. The battery alarm voltage recorded on each external medium can be copied as a file, or can be set by referring to this voltage.

The external interface 240 is an interface that radio connects to other radio communication device such as a portable telephone and a personal handyphone system (PHS). The external interface 240 is used to transmit various kinds of information such as image data captured by a camera to the outside by radio communications, for example.

The audio unit 260 has the microphone 262 that is used to input voice, and the speaker 261 that outputs the voice. The speaker 261 functions as a communication unit to notify in voice a setting of the battery alarm voltage.

The power source circuit 270 has a function of supplying the operation power source to the PDA 110 to operate this PDA when the power source switch 290 is turned ON, and monitoring the battery voltage within the battery 280. A lithium battery or the like is used for the battery 280.

On the other hand, the battery management server 100 includes the battery alarm voltage controller 120 which includes a battery voltage transition calculator 130 and the battery alarm voltage setter 140, and a communication interface 150. 145 denotes an input unit that carries out a manual input. A keyboard and a mouse are used for this input unit.

The battery voltage transition calculator 130 has a function of calculating in time series in advance a charge transition from the battery alarm voltage to the suspend voltage based on the obtaining of the battery voltage detected by the battery voltage detector 170.

The battery alarm voltage controller 120 has a function of receiving the battery voltage periodically detected by the battery alarm voltage detector 170 with the communication interface 150, and setting the battery alarm voltage using the battery alarm voltage setter 140. The battery alarm voltage set by the battery alarm voltage setter 140 is transmitted from the communication interface 150 to the communication interface 300 at the PDA 110 side.

Figure 2:
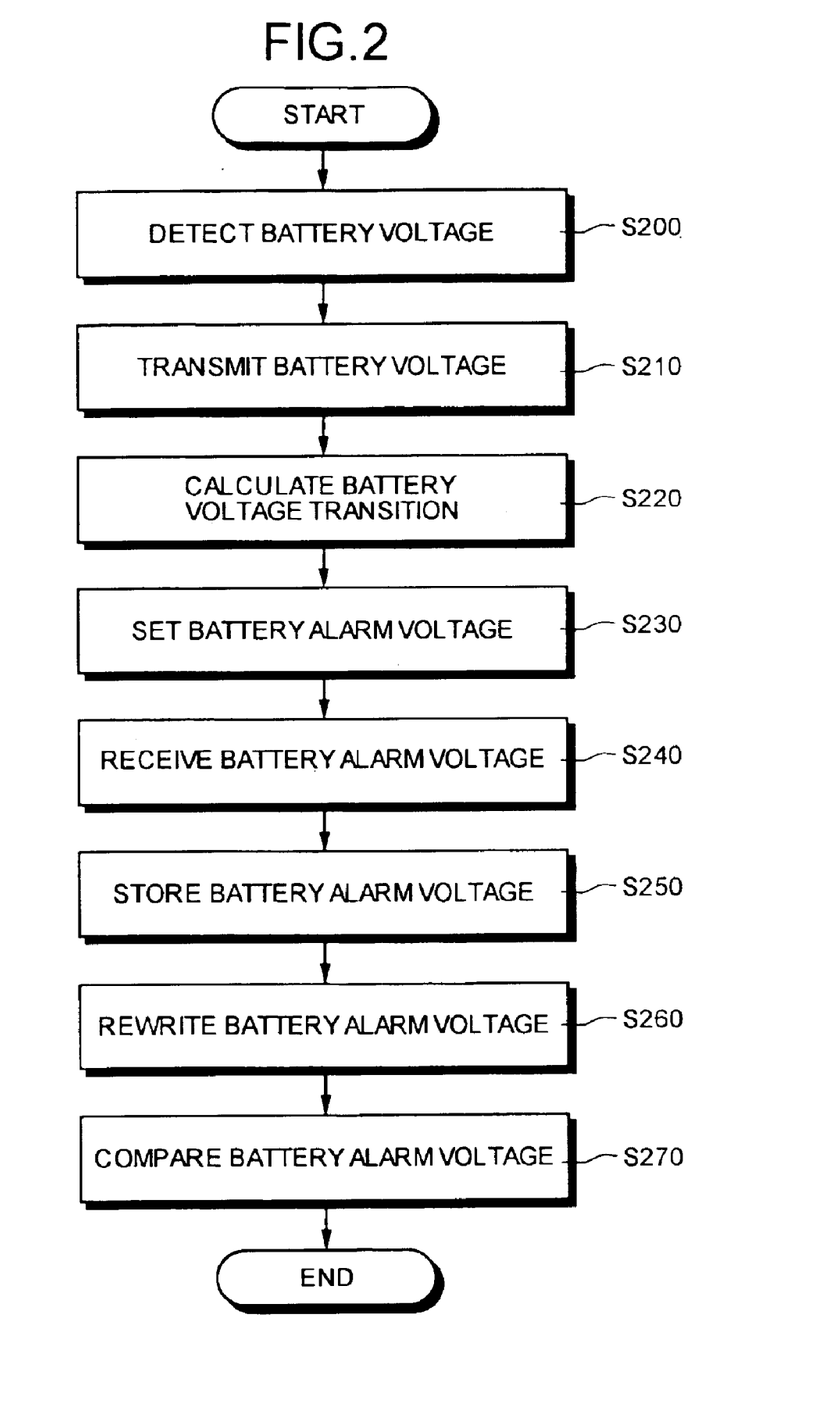
FIG. 2 is a flowchart of processing steps of setting the battery alarm voltage according to the present invention.

FIG. 2 is a flowchart of a total control configuration for the battery alarm voltage setting device, and the battery alarm voltage setting method according to the present invention. The battery alarm voltage setting method according to the present invention includes eight processing steps of (1) a battery voltage detection step (step S200), (2) a battery voltage transmission step (step S210), (3) a battery voltage transition calculation step (step S220), (4) a battery alarm voltage setting step (step S230), (5) a battery alarm voltage reception step (step S240), (6) a battery alarm voltage storing step (step S250), (7) a battery alarm voltage rewriting step (step S260), and (8) a battery alarm voltage comparison step (step S270). Each of these processing steps (1) to (8) will be explained first.

(1) The battery voltage detection step is a processing step of detecting a battery voltage charged within the battery 280. At this battery voltage detection step, the battery voltage within the battery 280 can be detected in real time as a voltage that varies (drops) following a discharging of the battery. When the battery voltage further drops from the battery alarm voltage, the voltage becomes the suspend voltage. When the battery voltage drops (discharges) to the suspend voltage, the device stops the operation.

(2) The battery voltage transmission step is a processing step of transmitting the battery voltage detected at the battery voltage detection step, from the communication interface 300 of the PDA 110 to the communication interface 150 of the battery management server 100. At this battery voltage transmission step, the battery voltage is transmitted periodically at each predetermined interval.

(3) The battery voltage transition calculation step is a processing step of receiving the battery voltage transmitted from the communication interface 300 of the PDA 110, with the communication interface 150, and preparing a forecast discharge curve based on this battery voltage. Specifically, a discharge transition from the battery alarm voltage to the suspend voltage can be calculated in time series, based on the battery voltage detected at the battery voltage detection step.

(4) The battery alarm voltage setting step is a processing step of setting the battery alarm voltage, based on the transition of the discharge curve calculated at the battery voltage transition calculation step.

(5) The battery alarm voltage reception step is a processing step of receiving the battery alarm voltage transmitted from the communication interface 150 of the battery management server 100, with the communication interface 300 of the PDA 110.

(6) The battery alarm voltage storing step is a processing step of temporarily storing the battery alarm voltage received by the communication interface 300, into the battery alarm voltage storage 200.

(7) The battery alarm voltage rewriting step is a processing step of rewriting the battery alarm voltage stored in the battery alarm voltage storage 200 into the latest battery alarm voltage set by the battery alarm voltage setter 140. Specifically, the battery alarm voltage rewriting step has a function of correcting the battery alarm voltage, in order to change the battery alarm voltage that is set initially.

(8) The battery alarm voltage comparison step is a processing step of comparing the battery alarm voltage that is obtained by rewriting with the battery alarm voltage rewriter 210 with the latest battery alarm voltage that is set by the battery alarm voltage setter 140.

Figure 3:
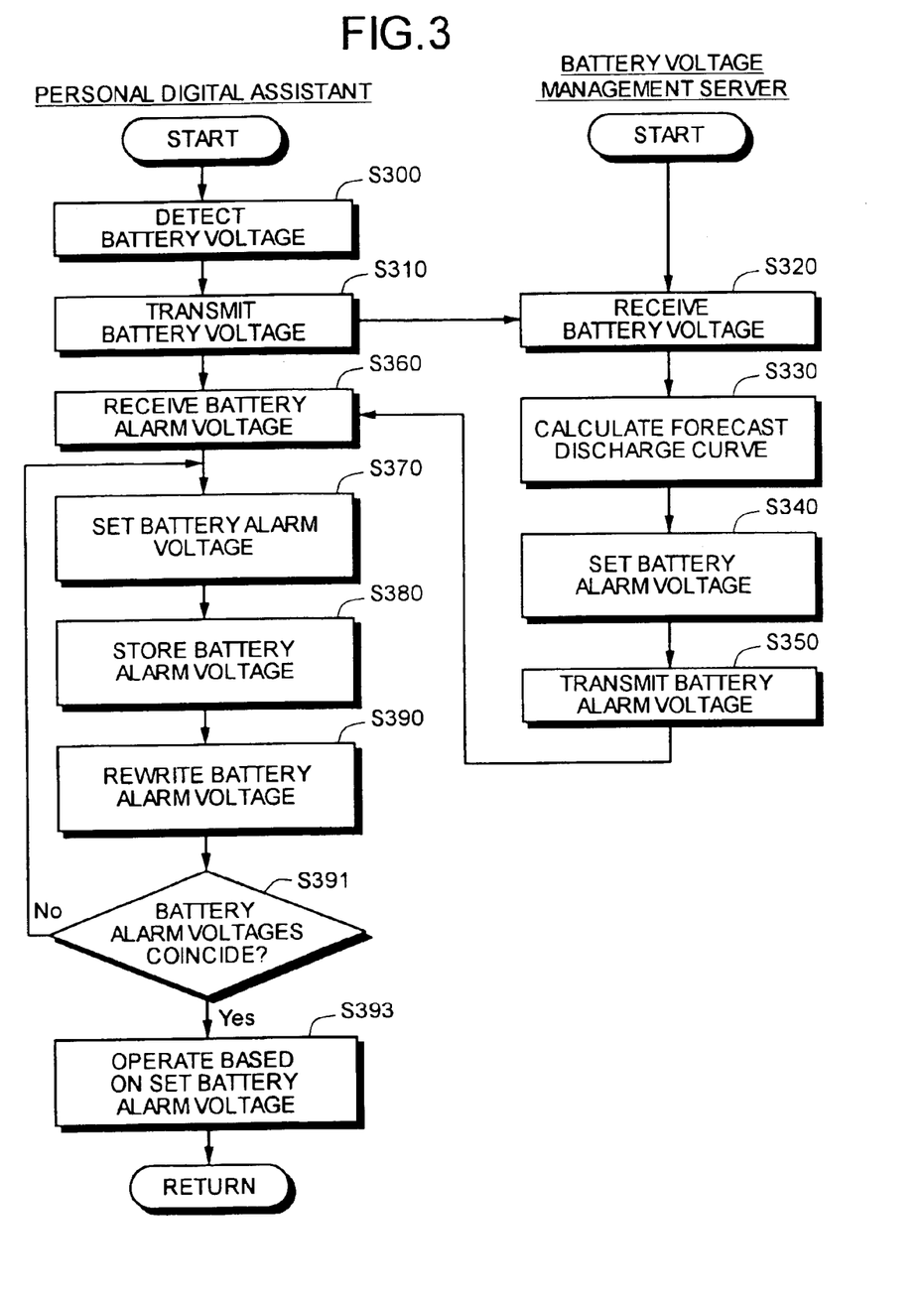
FIG. 3 is a flowchart of processing steps of setting the battery alarm voltage according to a first embodiment of the present invention.
Figure 4:
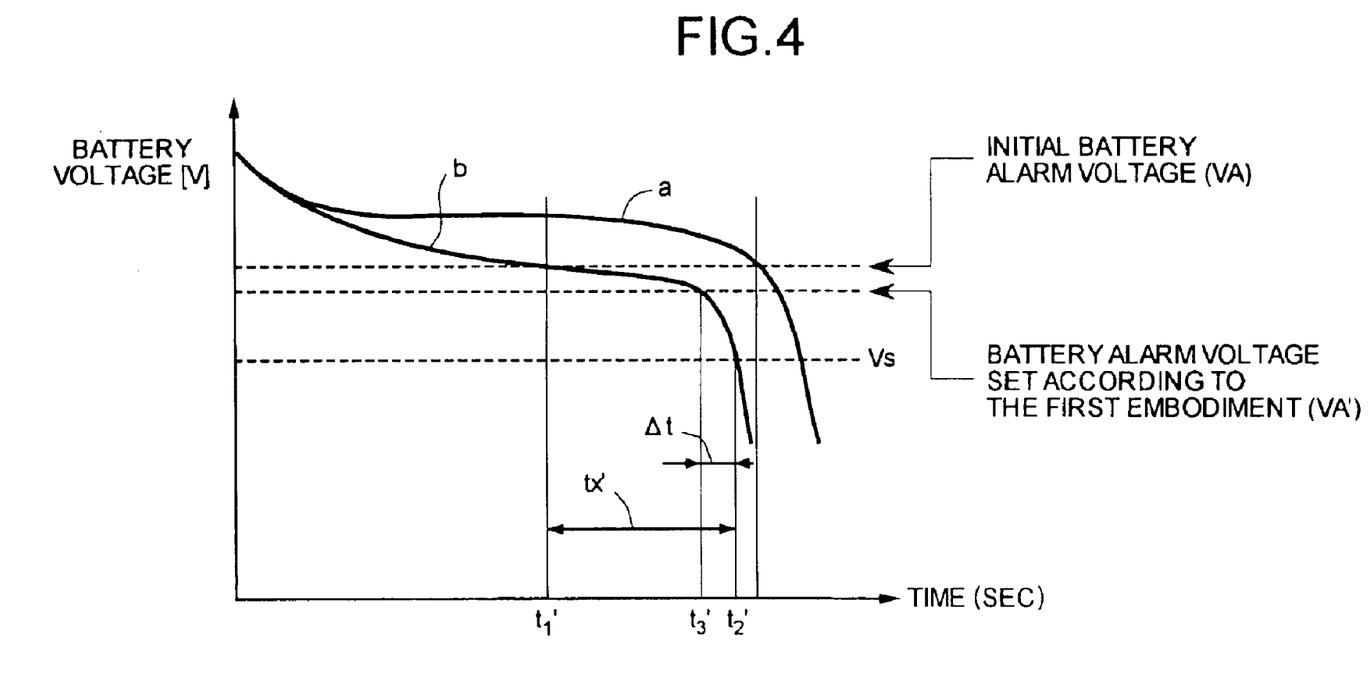
FIG. 4 is a graph of a time-varying transition of a discharge curve to which the first embodiment is applied.

The battery alarm voltage setting method used by the battery management server according to the present invention will be explained in detail below with reference to FIG. 3 and FIG. 4. FIG. 3 is a flowchart illustrating processing steps of the battery alarm voltage setting method. FIG. 4 is an explanatory view of a time series transition of a discharge curve to which the first embodiment is applied.

As shown in the flowchart of FIG. 3, first at the PDA 110 side (i.e., personal digital assistant), the battery voltage detector 170 detects the voltage of the battery 280 (battery voltage V) (step S300). The battery voltage detector 170 periodically detects the battery voltage at each predetermined interval. The detected voltage is transmitted from the communication interface 300 of the PDA 110 to the battery alarm voltage controller 120 via the communication interface 150 of the battery management server 100 (step S310).

On the other hand, in the battery management server 100, the battery alarm voltage controller 120 receives the battery voltage transmitted from the PDA 110 (step S320). A forecast discharge curve is calculated based on the received battery voltage (step S330). The battery voltage transition calculator 130 prepares (i.e., calculates) the discharge curve based on the battery voltage.

Based on the transition of the discharge curve prepared at step S330, the battery alarm voltage setter 180 calculates and sets a battery alarm voltage VA', and transmits the set battery alarm voltage from the communication interface 150 via the communication interface 300 of the PDA 110 (step S350).

Specifically, when the battery voltage is obtained, the record of the voltage is prepared as a discharge curve. Based on the discharge curve that is forecast in time series, the battery alarm voltage set initially is automatically set and changed a new battery alarm voltage.

The battery alarm voltage setter 140 sets the battery alarm voltage as a voltage smaller than the battery alarm voltage set initially and larger than the suspend voltage. This setting is carried out in order to prevent the device from stopping before the alarm is notified to the user when the battery alarm voltage is set smaller than the suspend voltage.

On the other hand, the PDA 110 receives the battery alarm voltage transmitted from the battery management server 100 at step S350 (step S360). The PDA 110 sets the battery alarm voltage as a set value (step S370), and stores this set value into the battery alarm voltage storage 200 (step S380). Next, the battery alarm voltage rewriter 210 rewrites the battery alarm voltage (step S390).

It is determined whether the battery alarm voltage transmitted from the battery management server 100 at step S391 coincides with the battery alarm voltage obtained by rewriting with the battery alarm voltage rewriter 210 and stored in the battery alarm voltage storage 200 (step S391).

The battery alarm voltage comparing unit 220 makes the decision at step S391. The battery alarm voltage comparing unit 220 can confirm whether the setting of the battery alarm voltage is changed accurately. When it is determined at step S391 that the battery alarm voltage within the battery alarm voltage storage 200 is rewritten accurately (Yes at step S391), the PDA 110 is operated (controlled) based on the rewritten battery alarm voltage (step S393).

When it is confirmed that the setting of the battery alarm voltage is changed accurately, the display unit 231 may display a message of "setting completed" or the speaker 261 may be used to notify about the setting in voice.

On the other hand, when it is determined at step S391 that the battery alarm voltage in the battery alarm voltage storage 200 does not coincide with the battery alarm voltage transmitted from the battery management server 100 (No at step S391), the battery alarm management server 100 transmits again the battery alarm voltage set by the battery alarm voltage setter 140. This voltage is stored into the battery alarm voltage storage 200. Control is carried out based on the stored battery alarm voltage (step S393).

The work effect of the battery alarm voltage setting method according to the first embodiment will be explained in detail with reference to FIG. 4. In FIG. 4, as described above, the discharge curve b represents the transition of the battery voltage of the degraded battery. The battery alarm voltage VA represents the voltage set initially, and the battery alarm voltage VA' represents the voltage set according to the first embodiment.

As shown in FIG. 4, when the battery alarm voltage is set to the initial voltage VA, the voltage reaches the battery alarm voltage VA after t1' seconds. The voltage reaches the suspend voltage after t2' seconds, that is after the lapse of tx' seconds from the t1' seconds.

On the other hand, when the battery alarm voltage is set to VA' that is lower than VA, the battery voltage reaches the battery alarm voltage VA' in t3' seconds. Therefore, the operating time can be held longer than the conventional operating time t1' (t1'<t3'). Further, the time taken to reach the suspend voltage Vs can be set to $\Delta t$ seconds (tx'>$\Delta t$). Consequently, the operation time of the PDA 110 can be held longer than the conventional time. In addition, the number of times of charging the battery can be reduced.

As explained above, according to the first embodiment, the battery management server 100 includes the battery alarm voltage controller 140 that can automatically change the initial setting of battery alarm voltage to a predetermined voltage, based on the battery voltage detected by the battery voltage detector 170 at the PDA 110 side. Therefore, the set value of the battery alarm voltage can be automatically changed based on the battery voltage.

In the first embodiment, the battery management server 100 automatically changes the setting of the battery alarm voltage based on the battery voltage V transmitted from the PDA 110 side. In the second embodiment, the battery management server 100 makes it possible to carry out a manual setting of the battery alarm voltage.

Specifically, when the battery alarm voltage cannot be set automatically in the first embodiment, the battery alarm voltage is set manually according to the second embodiment.

Figure 5:
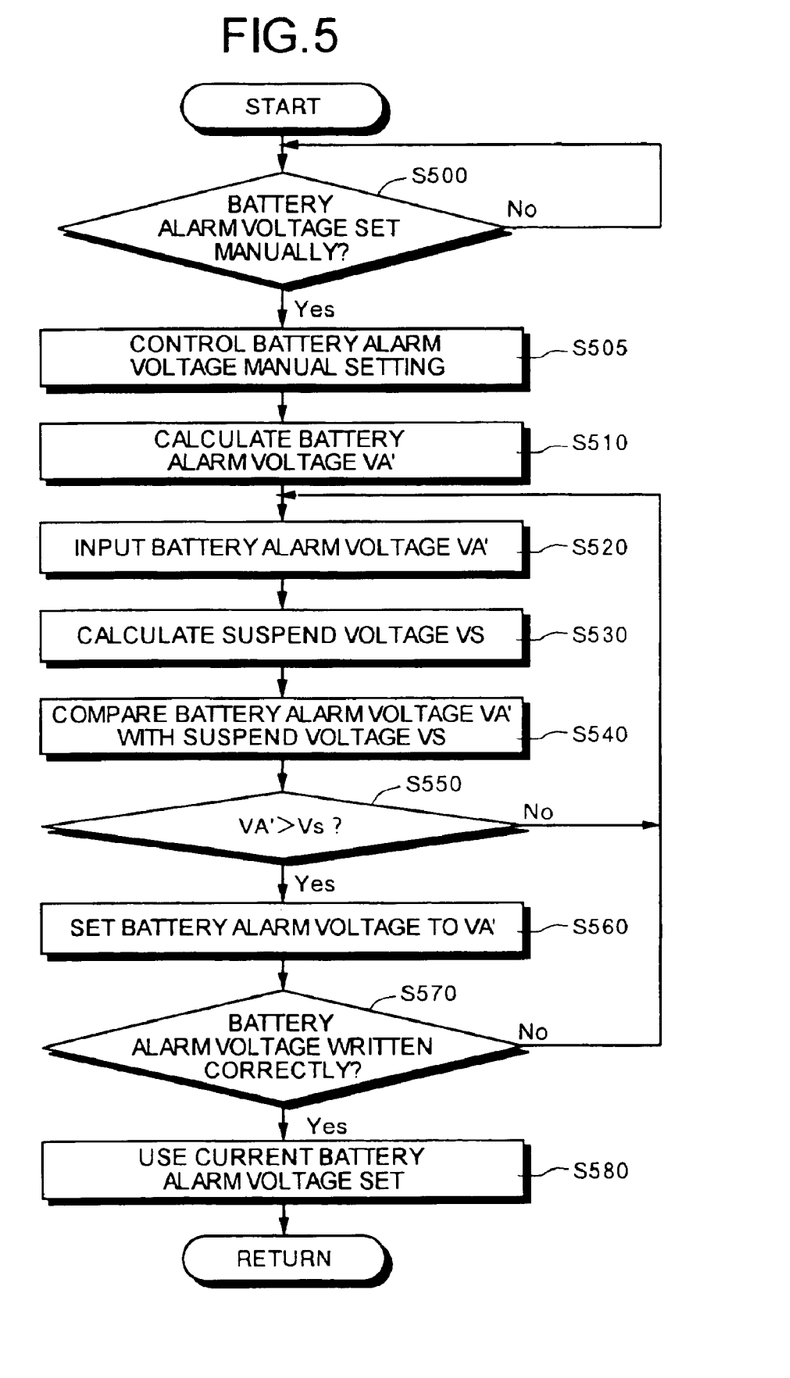
FIG. 5 is a flowchart of processing steps of setting the battery alarm voltage according to a second embodiment of the present invention.

Processing steps of the battery alarm voltage setting method according to the second embodiment will be explained. FIG. 5 is a flowchart illustrating the processing steps of the battery alarm voltage setting method according to the second embodiment.

As shown in the flowchart of FIG. 5, it is first determined whether the battery alarm voltage is set automatically or manually (step S500). When it is determined that the battery alarm voltage is set manually, the process proceeds to the next battery alarm voltage manual setting control at step S505 (step S505).

This battery alarm voltage manual setting control can be carried out based on the selection of one of the following control methods. (1) When the battery management server 100 arranges the manual setting of the battery alarm voltage, data other than the set battery alarm voltage is not transmitted to the PDA 110. (2) When the battery management server 100 arranges the manual setting of the battery alarm voltage, the data transmission from the PDA 110 side is stopped at this point of time. (3) When the PDA 110 determines that the battery management server 100 arranges the manual setting of the battery alarm voltage, the data transmission from the PDA 110 side is stopped at this point of time. (4) The battery voltage server 100 transmits to the PDA 110 that the battery voltage is set manually, and the updating of the battery alarm voltage is not received until when the manual setting is cancelled.

After the process proceeds to the battery alarm voltage manual setting control at step S505, the battery voltage transition detector 130 calculates the battery alarm voltage VA' (step S510). After the battery alarm voltage setter 140 sets the battery alarm voltage, the set battery alarm voltage is input (step S520). This battery alarm voltage VA' is input by manually operating the keyboard or the mouse of the input unit 145.

Next, the suspend voltage detector 190 calculates the suspend voltage VS. At step S540, the battery alarm voltage VA' is compared with the suspend voltage VS. Specifically, the voltage larger than the calculated suspend voltage VS is manually input and set.

In other words, at step S550, a decision is made based on the comparison between the battery alarm voltage VA' and the suspend voltage VS. When the battery alarm voltage VA manually set is larger than the suspend voltage VS (VA'>VS) (Yes at step S550), this voltage VA' is set as the battery alarm voltage. Next, it is determined whether the battery alarm voltage VA' is correctly written into the battery alarm voltage storage (step S570). When the battery alarm voltage VA' is written correctly (Yes at step S570), the battery alarm voltage is used based on the battery alarm voltage manually set at step S580 (step S580).

On the other hand, when the battery alarm voltage VA is smaller than the suspend voltage VS (No at step S550), the battery alarm voltage is input again at step S520. Specifically, the set value is changed so that the voltage becomes larger than the battery alarm voltage set last time.

In the present embodiment, the battery management server 100 arranges the manual setting of the battery alarm voltage. However, it is needless to mention that the battery alarm voltage can also be set manually at the PDA 110 side. The keyboard at the input unit 250 is used to manually input the battery alarm voltage at the PDA 110 side.

As explained above, according to the second embodiment, the battery alarm voltage setter 140 can optionally set the battery alarm voltage based on the manual setting arranged by the battery management server 100. Therefore, when the battery alarm voltage cannot be set automatically, the battery alarm voltage can be easily set manually.

Figure 6:
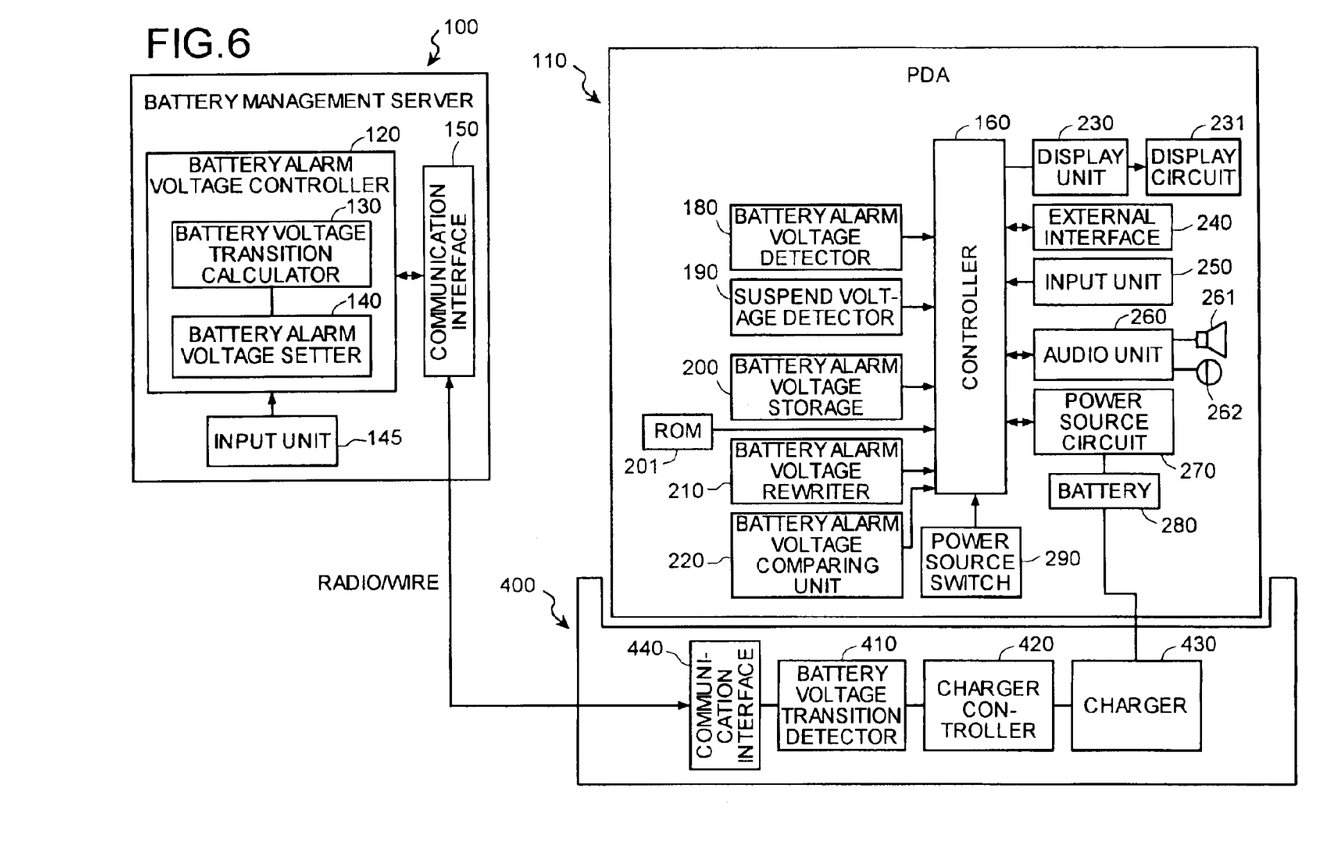
FIG. 6 is a schematic diagram of an apparatus for setting the battery alarm voltage according to a third embodiment of the present invention.

FIG. 6 is a functional block diagram of a battery alarm voltage setting device according to the third embodiment. As shown in the drawing, according to the third embodiment, the cradle 400 that is used as a charger to the PDA 110 has a function of detecting the battery voltage and transmitting the time series transition of the obtained battery voltage to the battery management server 100.

For this purpose, the cradle 400 has a battery voltage transition detector 410, a charge controller 420, and a charger 430. The battery voltage transition detector 410 has a function of detecting the battery voltage and obtaining the residual amount of the battery when the PDA 110 is set to the cradle 400. In the third embodiment, the PDA 110 may not have the battery voltage detector. The charge controller 420 has a function of controlling the charge quantity and the charge time to the charger 430 corresponding to the battery voltage residual amount within the battery 280 of the PDA 110.

A communication interface 440 can transmit the battery voltage obtained by the battery voltage transition detector 410 to the communication interface 150 of the battery management server 100. Therefore, in the third embodiment, the communication interface may not be provided in the PDA 110.

Figure 7:
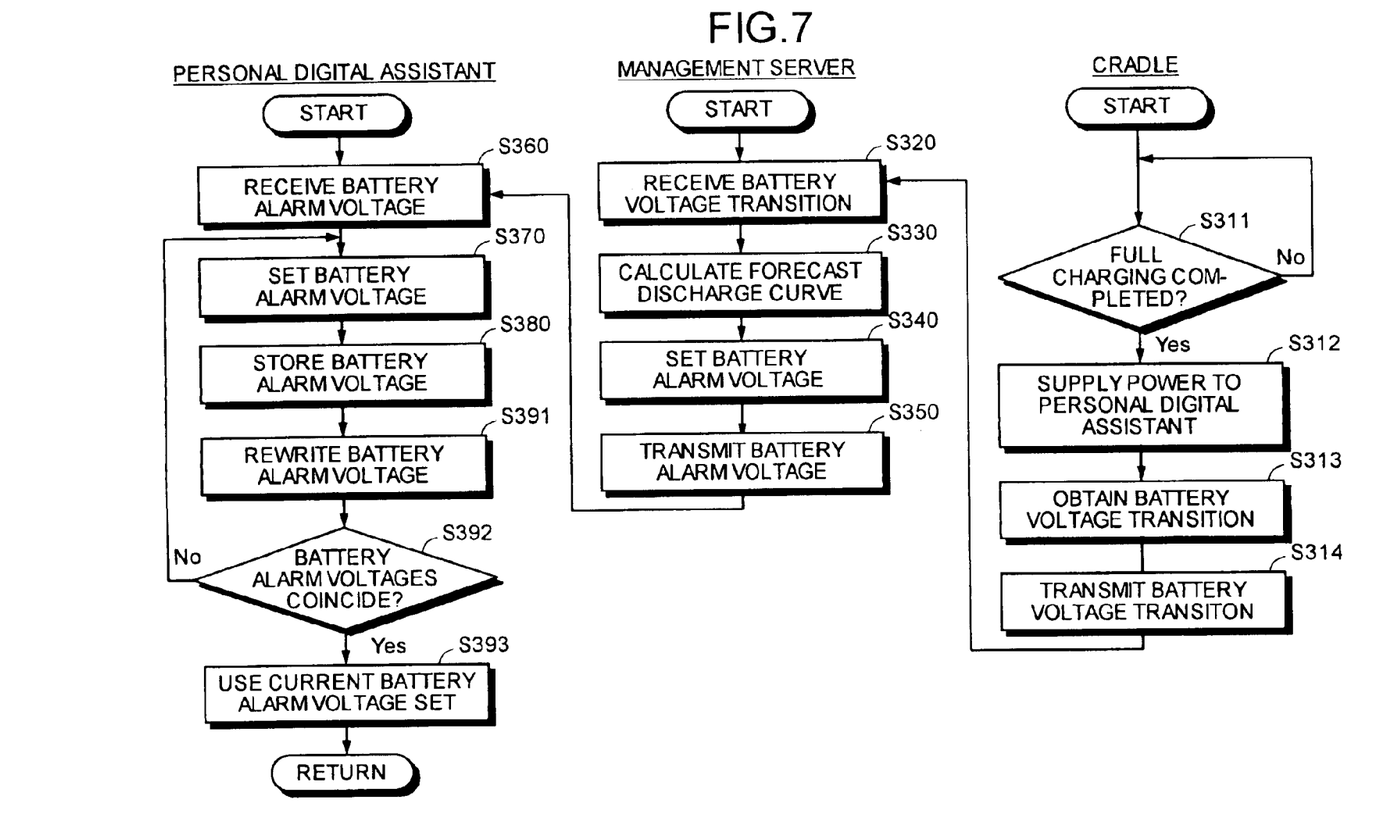
FIG. 7 is a flowchart of processing steps of setting the battery alarm voltage according to the third embodiment.

Processing steps of the battery alarm voltage setting method according to the third embodiment will be explained. FIG. 7 is a flowchart illustrating processing steps of the battery alarm voltage setting method according to the third embodiment.

As shown in the flowchart of FIG. 7, the cradle 400 first determines whether the PDA 110 is fully charged (step S311). When the PDA 110 is fully charged (Yes at step S311), power is supplied (ON) to the PDA 110 (step S312). Next, the battery voltage transition detector 410 detects the transition of the battery voltage, and obtains the battery voltage (step S313). The battery voltage obtained at step S313 is transmitted to the battery management server 100 (step S314).

On the other hand, the battery management server 100 receives the battery voltage transmitted from the cradle 400 (step S320). The battery management server 100 prepares the forecast discharge curve based on the battery voltage in the processing at step S330 to step S350 in a similar manner to that in the flow shown in FIG. 3. Based on the prepared discharge curve, the battery alarm voltage setter 180 calculates and sets the battery alarm voltage VA'. The communication interface 150 transmits the set battery alarm voltage via the communication interface 300 of the PDA 110 (step S350).

On the other hand, the PDA 110 receives the battery alarm voltage transmitted from the battery management server 100 at step S350 (step S360). The PDA 110 stores the setting of the battery alarm voltage transmitted from the battery management server 100 into the battery alarm voltage storage 200 in the processing at step S370 to step S393, in a similar manner to the processing steps shown in FIG. 3. The battery alarm voltage rewriter 210 rewrites the battery alarm voltage. The PDA 110 controls the battery alarm voltage based on the rewritten battery alarm voltage (step S393).

As explained above, according to the third embodiment, the cradle 400 as a charger to the PDA 110 has the function of detecting the transition of the residual amount of the battery, and obtains the battery voltage from the cradle. The battery management server can set the battery alarm voltage based on the forecast of the discharge transition. Therefore, the PDA 110 can have a simple circuit configuration, which improves the convenience, and achieves cost reduction.

In order to realize the configurations that the battery alarm voltage setters and the battery alarm voltage setting methods shown in the first to third embodiments have, a program that realizes the configuration can be recorded onto a computer-readable recording medium. A computer reads and executes the program recorded on the recording medium. With this arrangement, a general computer system can be used to realize the effects similar to those obtained from the battery alarm voltage setters and the battery alarm voltage setting methods shown in the first to third embodiments.

The recording medium includes a portable storage such as a CD-ROM, a floppy disk, a digital versatile disk (DVD) disk, an optical magnetic disk, and an integrated circuit (IC) card, a storage such as a hard disk, a server database that holds a model built-up program that is connected via a local area network (LAN), and a transmission medium on a public network.

As explained above, according to the present invention, when a battery is used after a long time usage, the battery management server detects a battery voltage, and calculates a discharge curve in advance based on the degradation of the battery (battery residual amount). With this arrangement, the battery alarm voltage can be set automatically. The degraded battery can be used efficiently, and the number of times of charging can be reduced. Therefore, there is an effect of improving the user's convenience.

Further, according to the present invention, the cradle as a charger to the personal digital assistant has a function of detecting a transition of the residual amount of the battery. The battery voltage is obtained from the cradle. The battery management server sets the battery alarm voltage based on the forecast discharge transition. Therefore, there is an effect that the circuit configuration of the personal digital assistant can be made simple, and that the convenience and cost reduction can be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for setting a battery alarm voltage for a mobile information terminal that is capable of communicating with a battery management server, wherein
the mobile information terminal includes
a battery voltage detecting unit that detects a voltage of a battery;
an alarm voltage detecting unit that detects a battery alarm voltage for alarming a voltage drop of the battery;
a suspend voltage detecting unit that detects a suspend voltage at which the mobile information terminal enters a suspend state following the voltage drop of the battery; and
a terminal communication unit that transmits the voltage of the battery detected to the battery management server, and
the battery management server includes
a voltage controller that automatically sets the battery alarm voltage based on the voltage of the battery detected; and
a server communication unit that transmits the battery alarm voltage set to the mobile information terminal.

2. The apparatus according to claim 1, wherein the voltage controller further includes
an estimating unit that estimates a time-varying discharge transition from the battery alarm voltage to the suspend voltage based on the voltage of the battery detected; and
a setting unit that sets the battery alarm voltage based on the time-varying discharge transition estimated.

3. The apparatus according to claim 1, wherein the battery alarm voltage is set to a voltage at which the mobile information terminal lasts a predetermined operation time from the battery alarm voltage to the suspend voltage.

4. The apparatus according to claim 1, wherein the setting unit has a mechanism that the battery alarm voltage is manually set to an arbitrary voltage.

5. The apparatus according to claim 1, wherein the mobile information terminal further includes a storage unit that obtains and stores the battery alarm voltage, and a rewriting unit that rewrites the battery alarm voltage stored in the storage unit.

6. The apparatus according to claim 5, wherein the battery alarm voltage stored in the storage unit is rewritable by either of an input unit of the mobile information terminal and an external medium.

7. The apparatus according to claim 5, wherein the mobile information terminal further includes a comparing unit that compares a value of the battery alarm voltage set by the setting unit with a value of the battery alarm voltage rewritten by the rewriting unit.

8. The apparatus according to claim 7, wherein the mobile information terminal further includes a notification unit that makes a notification of an operation status on the mobile information terminal, wherein when the battery alarm voltage set by the setting unit coincides with the battery alarm voltage rewritten by the rewriting unit from a result of a comparison by the comparing unit, the notification unit notifies a completion of setting of the battery alarm voltage.

9. The apparatus according to claim 8, wherein the notification unit notifies the completion of setting of the battery alarm voltage by a message display.

10. The apparatus according to claim 8, wherein the notification unit notifies the completion of setting of the battery alarm voltage by a sound through a speaker.

11. The apparatus according to claim 7, wherein when the battery alarm voltage set by the setting unit coincides with the battery alarm voltage rewritten by the rewriting unit from a result of a comparison by the comparing unit, the rewriting unit rewrites the battery alarm voltage stored in the storage unit.

12. The apparatus according to claim 11, wherein the battery alarm voltage set by the setting unit is smaller than a preset battery alarm voltage and larger than the suspend voltage.

13. The apparatus according to claim 12, wherein the setting unit further has a function of setting a lower limit of the battery alarm voltage, and when the battery alarm voltage set is smaller than the lower limit, the setting unit sets the battery alarm voltage again.

14. The apparatus according to claim 5, wherein upon the mobile information terminal receiving of an information that a manual setting is carried out from the battery management server, the rewriting unit does not accept an updating of the battery alarm voltage until the manual setting is released.

15. The apparatus according to claim 1, wherein the mobile information terminal is any one of a notebook-size personal computer, a personal digital assistant, an electronic note, and a mobile phone.

16. A method of setting a battery alarm voltage for a mobile information terminal that is capable of communicating with a battery management server, the method comprising:

detecting a voltage of a battery;

detecting a battery alarm voltage for alarming a voltage drop of the battery;

detecting a suspend voltage at which the mobile information terminal enters a suspend state following the voltage drop of the battery;

transmitting the voltage of the battery detected to the battery management server;

setting automatically the battery alarm voltage based on the voltage of the battery detected; and transmitting the battery alarm voltage set to the mobile information terminal.

* * * * *